(12) United States Patent
Singh et al.

(10) Patent No.: US 10,236,367 B2
(45) Date of Patent: Mar. 19, 2019

(54) BIPOLAR SEMICONDUCTOR DEVICE WITH SILICON ALLOY REGION IN SILICON WELL AND METHOD FOR MAKING

(71) Applicant: GLOBALFOUNDRIES Inc., Grand Cayman (KY)

(72) Inventors: Jagar Singh, Clifton Park, NY (US); Shiv Kumar Mishra, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/642,732

(22) Filed: Jul. 6, 2017

(65) Prior Publication Data

US 2019/0013397 A1   Jan. 10, 2019

(51) Int. Cl.

| | |
|---|---|
| *H01L 29/06* | (2006.01) |
| *H01L 21/02* | (2006.01) |
| *H01L 29/737* | (2006.01) |
| *H01L 29/10* | (2006.01) |
| *H01L 29/08* | (2006.01) |

(Continued)

(52) U.S. Cl.
CPC .... *H01L 29/7371* (2013.01); *H01L 21/02381* (2013.01); *H01L 21/02532* (2013.01); *H01L 29/0688* (2013.01); *H01L 29/0692* (2013.01); *H01L 29/0817* (2013.01); *H01L 29/0821* (2013.01); *H01L 29/1004* (2013.01); *H01L 29/1095* (2013.01); *H01L 29/165* (2013.01); *H01L 21/266* (2013.01); *H01L 29/66681* (2013.01); *H01L 29/7816* (2013.01)

(58) Field of Classification Search
CPC .................................................. H01L 29/1095
See application file for complete search history.

(56) References Cited

U.S. PATENT DOCUMENTS

| | | |
|---|---|---|
| 6,448,599 B1 | 9/2002 | Wang |
| 7,645,651 B2 | 1/2010 | Huang et al. |

(Continued)

OTHER PUBLICATIONS

Ehwald et al., "High Performance RF LDMOS Transistors with 5nm Gate Oxide in a 025um SiGe:C BiCMOS Technology," IEDM 01-895-98, 2001 IEEE.

(Continued)

*Primary Examiner* — Eugene Lee

(74) *Attorney, Agent, or Firm* — Amerson Law Firm, PLLC

(57) ABSTRACT

A device includes a substrate, a first well doped with dopants of a first conductivity type defined in the substrate, and a second well doped with dopants of a second conductivity type different than the first conductivity type defined in the substrate adjacent the first well to define a PN junction. The second well includes a silicon alloy portion displaced from the PN junction. A collector region contacts one of the first or second wells and has a dopant concentration higher than its contacted well. An emitter region contacts the other of the first or second wells and is doped with dopants of the first or second conductivity type different than the first or second well contacted by the emitter region. A base region contacts the other of the first or second well and has a dopant concentration higher than the first or second well contacted by the base region.

20 Claims, 3 Drawing Sheets

(51) Int. Cl.
  *H01L 29/165* (2006.01)
  *H01L 29/78* (2006.01)
  *H01L 29/66* (2006.01)
  *H01L 21/266* (2006.01)

(56) References Cited

U.S. PATENT DOCUMENTS

| | | | |
|---|---|---|---|
| 8,796,685 | B2 | 8/2014 | Yang |
| 9,231,097 | B2* | 1/2016 | Lee ............... H01L 29/78 |
| 9,418,993 | B2 | 8/2016 | Singh |
| 2001/0048135 | A1 | 12/2001 | Leipold |
| 2002/0142558 | A1* | 10/2002 | Hsu ............... H01L 21/84 |
| | | | 438/311 |
| 2005/0139872 | A1 | 6/2005 | Chidambaram et al. |
| 2007/0262376 | A1* | 11/2007 | Dudek ............ H01L 29/0873 |
| | | | 257/336 |
| 2008/0265282 | A1* | 10/2008 | Gluschenkov ..... H01L 29/0821 |
| | | | 257/197 |
| 2010/0052057 | A1* | 3/2010 | Chung ............ H01L 29/0634 |
| | | | 257/362 |
| 2011/0156142 | A1 | 6/2011 | Teo et al. |
| 2012/0032303 | A1* | 2/2012 | Elkareh .......... H01L 29/41708 |
| | | | 257/587 |
| 2013/0113020 | A1* | 5/2013 | Liu ............... H01L 29/66242 |
| | | | 257/197 |
| 2014/0001602 | A1* | 1/2014 | McPartlin ........ H01L 29/732 |
| | | | 257/607 |
| 2014/0117412 | A1* | 5/2014 | Werner ........... H01L 29/267 |
| | | | 257/197 |
| 2015/0035053 | A1 | 2/2015 | Singh |
| 2015/0200299 | A1 | 7/2015 | Chen et al. |
| 2015/0236116 | A1* | 8/2015 | Chang ............ H01L 29/6625 |
| | | | 438/338 |
| 2016/0141413 | A1 | 5/2016 | Noh et al. |
| 2016/0149031 | A1 | 5/2016 | Jung |
| 2016/0225896 | A1 | 8/2016 | Yoo et al. |
| 2016/0276351 | A1 | 9/2016 | Tanaka et al. |
| 2017/0200823 | A1 | 7/2017 | Kang et al. |
| 2018/0012992 | A1 | 1/2018 | Lee et al. |

OTHER PUBLICATIONS

Orouji and Mehrad, The Best Control of Parasitic BJT Effect in SOI-LDMOS With SiGe Window Under Channel, IEEE Transactions on Electron Devices, 59:419-25, Feb. 2012.

Sun et al., "Performance of Trench Power MOSFET With Strained Si/SiGe Multilayer Channel," IEEE Transactions on Electron Devices, 58:1517-22, May 2011.

Office Action from related U.S. Appl. No. 15/642,675 dated Apr. 13, 2018.

Final Office Action from related U.S. Appl. No. 15/642,675 dated Oct. 23, 2018.

* cited by examiner

BIPOLAR SEMICONDUCTOR DEVICE WITH SILICON ALLOY REGION IN SILICON WELL AND METHOD FOR MAKING

BACKGROUND OF THE INVENTION

1. Field of the Invention

The present disclosure relates to semiconductor devices and to a method of forming semiconductor devices, and, more particularly, to a bipolar device with a silicon alloy region in a silicon well and methods for making same.

2. Description of the Related Art

In recent years, lateral double-diffused devices have been increasingly applied in high voltage and smart power applications. Generally, lateral double-diffused devices implement an asymmetric structure with a drift region. In general, there is a correlation between the on-resistance (RON) and the breakdown voltage (BV) of the device based on the selected semiconductor materials. Materials that provide increased BV generally have higher values for RON, and vice versa. For example, if silicon germanium (SiGe) is employed, the increased hole mobility of SiGe compared to silicon reduces RON, but the BV is reduced.

The present disclosure is directed to various methods of forming a bipolar device with a silicon alloy region formed in a silicon well and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present invention, a semiconductor device is provided. In accordance with illustrative embodiments herein, the semiconductor device includes, among other things, a substrate, a first well doped with dopants of a first conductivity type defined in the substrate, and a second well doped with dopants of a second conductivity type different than the first conductivity type defined in the substrate adjacent the first well to define a PN junction between the first and second wells. The second well includes a silicon alloy portion displaced from the PN junction. A collector region contacts one of the first well or the second well and has a dopant concentration higher than the first or second well contacted by the collector region. An emitter region contacts the other of the first well or the second well and is doped with dopants of the first or second conductivity type different than the first or second well contacted by the emitter region. A base region contacts the other of the first well or the second well and has a dopant concentration higher than the first or second well contacted by the base region.

In a second aspect of the present disclosure, a semiconductor device includes, among other things, a silicon substrate, a first well doped with dopants of a first conductivity type defined in the substrate, and a second well doped with dopants of a second conductivity type different than the first conductivity type defined in the substrate adjacent the first well to define a PN junction between the first and second wells. The second well includes a silicon germanium portion displaced from the PN junction. A collector region contacts one of the first well or the second well and has a dopant concentration higher than the first or second well contacted by the collector region. An emitter region contacts the other of the first well or the second well and is doped with dopants of the first or second conductivity type different than the first or second well contacted by the emitter region. A base region contacts the other of the first well or the second well and has a dopant concentration higher than the first or second well contacted by the base region.

BRIEF DESCRIPTION OF THE DRAWINGS

The disclosure may be understood by reference to the following description taken in conjunction with the accompanying drawings, in which like reference numerals identify like elements, and in which.

Figure 1A:
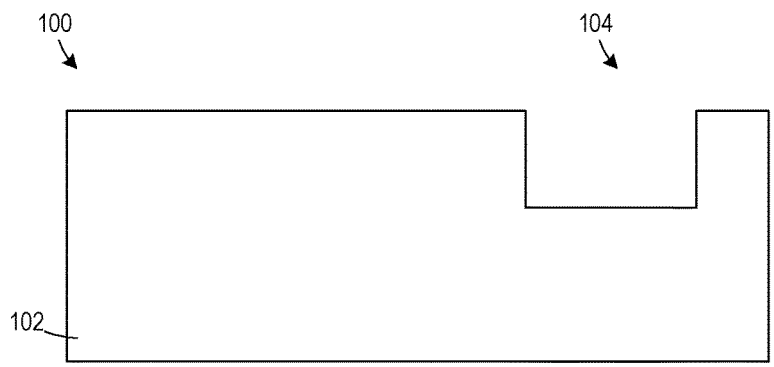
FIGS. 1A-1C depict various novel methods disclosed herein for forming a silicon alloy region in a silicon well and the resulting devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless or otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like.

Figure 1B:
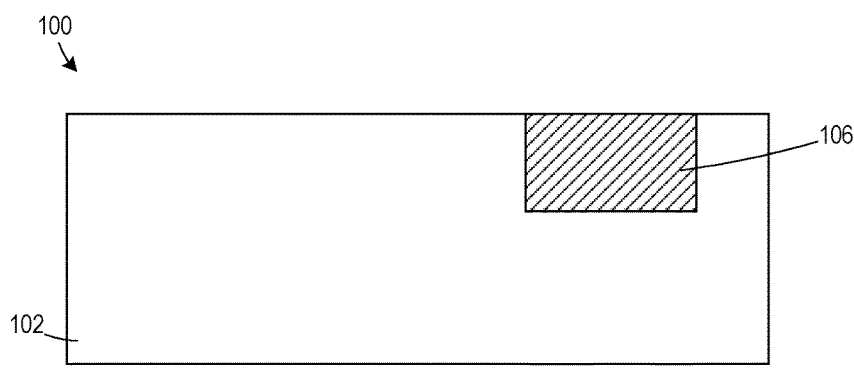
Figure 1C:
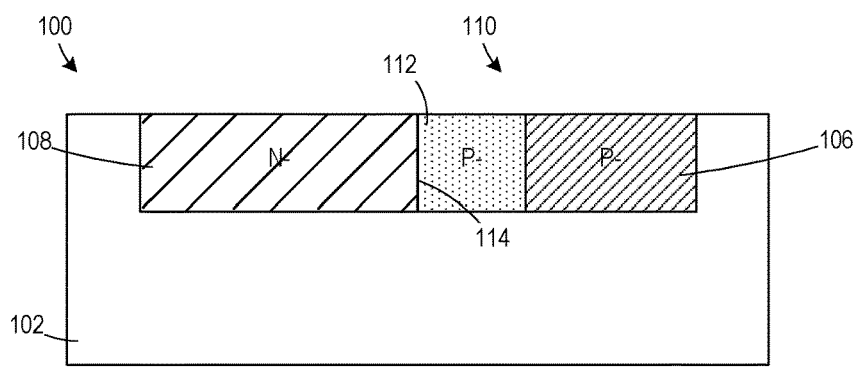

FIGS. 1A-1C schematically depict various illustrative embodiments of aspects of a novel LDMOS device 100 disclosed herein. In a general sense, in one broad aspect, the present disclosure is related to the formation of a novel device wherein a PN junction is formed between an N-well and a P-well formed in silicon regions. A silicon alloy region (e.g., silicon germanium—SiGe) is provided in the P-well laterally displaced from the PN junction. In some embodiments, other silicon alloys may be used, such as SiSn. The breakdown voltage of the device is governed by the silicon PN junction, but the on-resistance of the device is reduced by the silicon alloy region. Hence, increased breakdown voltage and decreased on-resistance may be achieved concurrently.

FIG. 1A illustrates the LDMOS device 100 at a very early stage of manufacture. An illustrative semiconducting substrate 102, such as a silicon substrate having a bulk or so-called silicon-on-insulator (SOI) configuration, is provided. Of course, the substrate 102 may be comprised of a variety of materials other than silicon, depending upon the particular application. The substrate 102 may be lightly pre-doped with dopants of a first conductivity type, such as P-type dopants (e.g., boron and the like), or may be undoped. A patterned etch process was performed to define a recess 104 in the substrate 102.

FIG. 1B illustrates the LDMOS device 100 after an epitaxial growth process was performed to define a silicon alloy region 106 in the recess 104. The silicon alloy region 106 may have a composition of $Si_xAlloy_{1-x}$, where x is generally less than 0.7. The silicon alloy region 106 may be doped in situ (e.g., with a P-type dopant) or it may be undoped.

FIG. 1C illustrates the LDMOS device 100 after a plurality of masked implantation processes were performed to define an N-well 108 (e.g., doped with an N-type dopant, such as phosphorus or arsenic) and a P-well 110 that includes a P-doped silicon region 112 and the silicon alloy region 106. In the general structure of FIG. 1C, a PN junction 114 is defined between the N-well 108 and the P-well 110. The breakdown voltage of the LDMOS device 100 is determined by the characteristics (e.g., material and doping) of the N-well 108 and the P-doped silicon region 112. In the illustrated embodiment, the N-well 108 and the P-doped silicon region 112 are both formed in silicon regions. The on-resistance of the LDMOS device 100 is affected by the characteristics of the P-doped silicon region 112 and the silicon alloy region 106. The presence of the silicon alloy region 106 reduces the on-resistance without sacrificing the higher breakdown voltage of silicon, as compared to the breakdown voltage of a silicon/silicon alloy PN junction. The general structure of the LDMOS device 100 of FIG. 1C may be adapted to a variety of semiconductor devices.

Figure 2:
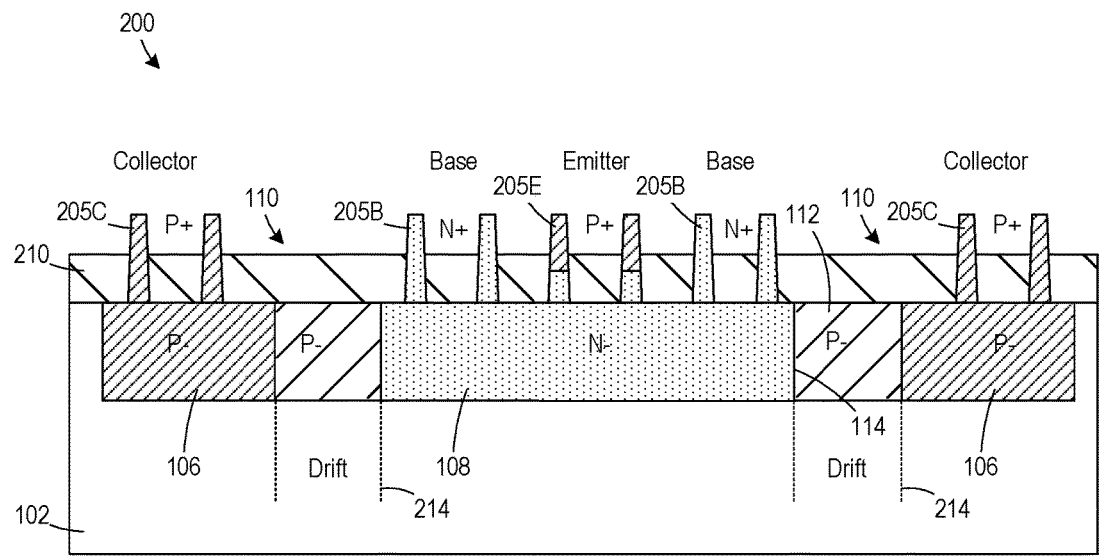
FIG. 2 illustrates a P-type bipolar device including the general structure of FIG. 1C.

FIG. 2 illustrates a P-type bipolar device 200 including the general structure of FIG. 1C. The N-well 108 is lightly doped (N−). The P-well 110 includes a lightly doped P-doped silicon region 112 (P−) and a lightly doped silicon alloy region 106 (P−). The P-well 110 may surround the N-well 108 (in a ring-like structure described below in reference to FIG. 4). After the general structure of FIG. 1C was formed, a masked etch process was performed to define a plurality of trenches in the substrate 102, thereby defining fins 205B, 205C, 205E. After forming the fins 205B, 205C, 205E, a layer of insulating material 210 was formed to define an isolation structure. The layer of insulating material 210 was planarized to expose top surfaces of the fins 205B, 205C, 205E (or a hard mask layer (not shown) formed above the fins 205B, 205C, 205E to pattern the trenches). The initial material of the fins 205E was partially removed, and an epitaxial growth process was formed to form P-doped silicon alloy replacement fins (P+), resulting in the fins 205E. The fins 205E may be doped in situ during the growth process, or a separate implantation process may be performed. Additional implantations may be performed to provide a high dopant concentration for the fins 205C, 205B (N+).

The fins 205B define a base region of the bipolar device 200. The fins 205C define a collector region of the bipolar device 200. The fins 205E define an emitter region of the bipolar device 200. Although the device 200 is illustrated as implementing the base, collector, and emitter regions using fins, in some embodiments, other types of doped regions may be employed, such as doped regions embedded in the respective P-well 110 or N-well 108. The P-well 110 defines a drift region 214 between the base and the collector. The P-well 110 has a decreased resistance due to the higher hole mobility of the silicon alloy region 106. The breakdown voltage of the bipolar device 200 is governed by the silicon material of the N-well 108 and the P-doped silicon region 112 at the PN junction 114.

Figure 3:
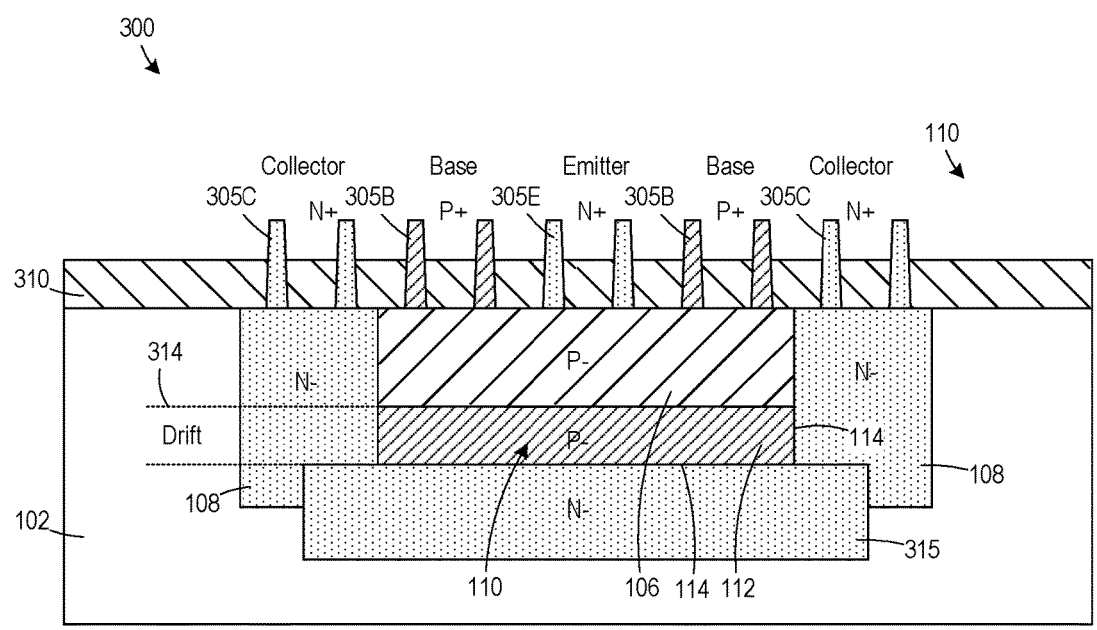
FIG. 3 illustrates an N-type bipolar device including the general structure of FIG. 1C.

FIG. 3 illustrates an N-type bipolar device 300 including the general structure of FIG. 1C. The P-well 110 includes a lightly doped P-doped silicon region 112 (P−) and a lightly doped silicon alloy region 106 (P−). The N-well 108 may surround the P-well 110 (in a ring-like structure described below in reference to FIG. 4). After the general structure of FIG. 1C was formed, a masked etch process was performed to define a plurality of trenches in the substrate 102, thereby defining fins 305B, 305C, 305E. After forming the fins 305B, 305C, 305E, a layer of insulating material 310 was formed to define an isolation structure. The layer of insulating material 310 was planarized to expose top surfaces of the fins 305C, 305C, 305E (or a hard mask layer (not shown) formed above the fins 305B, 305C, 305E to pattern the trenches). The initial material of the fins 305E was partially removed, and an epitaxial growth process was formed to form N-doped silicon replacement fins (N+), resulting in the fins 305E. The fins 305E may be doped in situ during the growth process, or a separate implantation process may be performed. Additional implantations may be performed to provide a high dopant concentration for the fins 305C, 305B (N+). An additional implantation process may also be performed to form a deep portion 315 of the N-well 108 (N−).

The fins 305B define a base region of the bipolar device 300. The fins 305C define a collector region of the bipolar device 300. The fins 305E define an emitter region of the bipolar device 300. Although the device 300 is illustrated as implementing the base, collector, and emitter regions using fins, in some embodiments, other types of doped regions may be employed, such as doped regions embedded in the respective P-well 110 or N-well 108. The P-well 110 defines a drift region 314 between the base and the collector. The P-well 110 has a decreased resistance due to the higher hole mobility of the silicon alloy region 106. The breakdown voltage of the bipolar device 300 is governed by the silicon material of the N-well 108 and the P-doped silicon region 112 at the PN junction 114.

Figure 4:
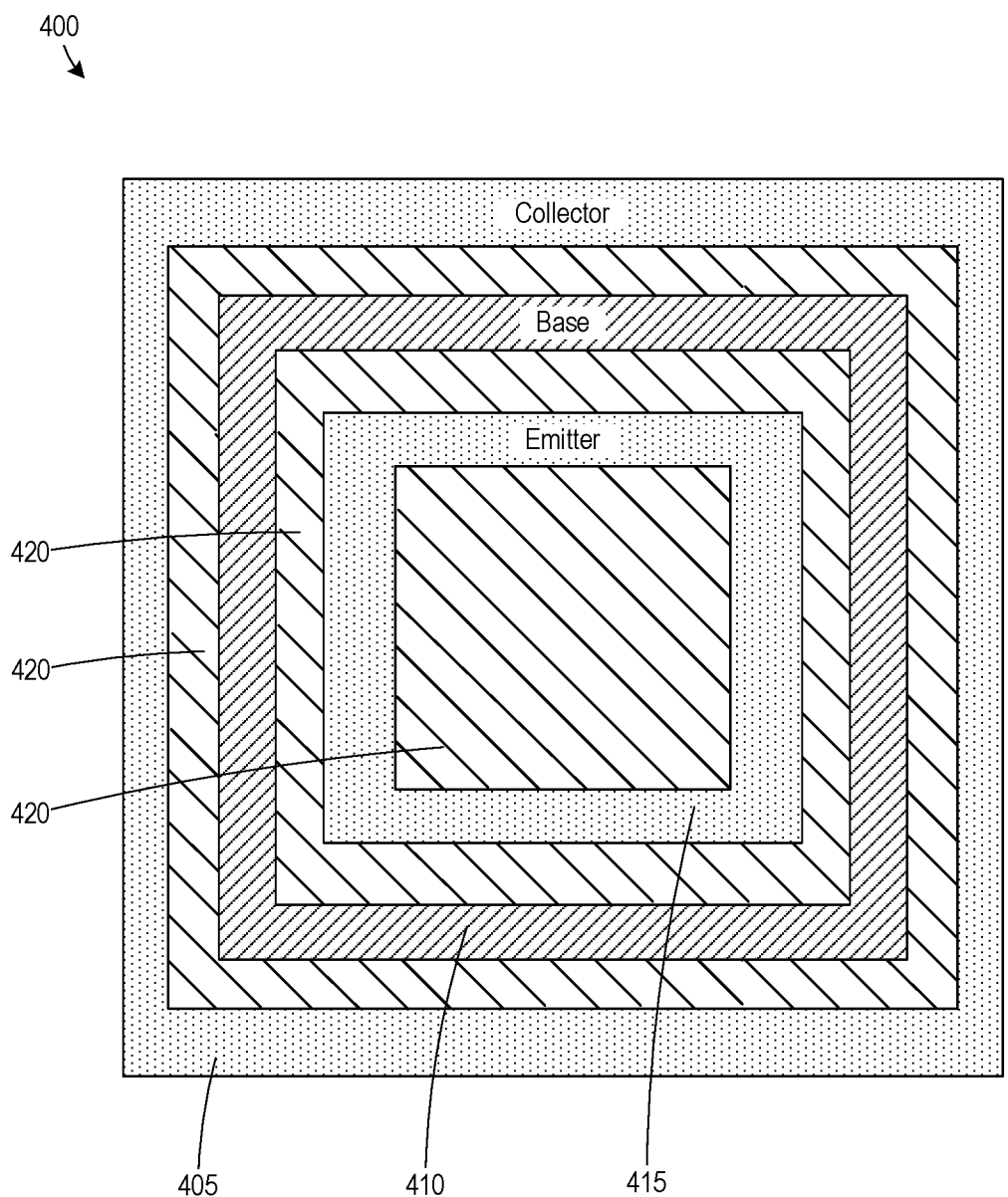
FIG. 4 is a simplified top view of a bipolar device that may represent the device of FIG. 2 or the device of FIG. 3.

FIG. 4 is a simplified top view of a bipolar device 400 that may represent the device 200 of FIG. 2 or the device 300 of FIG. 3. FIG. 4 illustrates an optional ring-like structure including a collector region 405, a base region 410, and an emitter region 415, corresponding to the bases, collector, and emitter regions illustrated in FIGS. 2 and 3. The regions 405, 410, 415 are separated by an isolation structure 420 (e.g., the layer of insulating material 210, 310 in FIGS. 2 and 3, respectively). For ease of illustration, not all of the features of FIGS. 2 and 3 are illustrated, such as the individual fins. Although a rectangular geometry is illustrated, in some embodiments, other geometries may be employed, such as circular or a combination of rectangular and circular.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A bipolar semiconductor device, comprising:
    a substrate;
    a first well doped with dopants of a first conductivity type defined in said substrate;
    a second well doped with dopants of a second conductivity type different than said first conductivity type defined in said substrate adjacent said first well to define a PN junction between said first and second wells, wherein said second well includes a silicon alloy region displaced from at least an upper portion of said PN junction;
    a collector region contacting a first portion of one of said first well or said second well and having a dopant concentration higher than said first or second well contacted by said collector region;
    an emitter region contacting a second portion of the other of said first well or said second well and being doped with dopants of said first or second conductivity type different than said first or second well contacted by said emitter region; and
    a base region contacting a third portion of the other of said first well or said second well, said base region and having a dopant concentration higher than said first or second well contacted by said base region, wherein said third portion is positioned between said first and second portions.

2. The semiconductor device of claim 1, wherein said collector region contacts said second well, said emitter region and said base region contact said first well, said collector region and said emitter region are doped with dopants of said second conductivity type, and said base region is doped with dopants of said first conductivity type.

3. The semiconductor device of claim 2, wherein said emitter region comprises a silicon alloy portion.

4. The semiconductor device of claim 2, wherein said collector region contacts said silicon alloy region of said second well.

5. The semiconductor device of claim 4, wherein said second well defines a drift region between said first portion and said second portion.

6. The semiconductor device of claim 4, wherein a portion of said second well not including said silicon alloy region has a depth equal to that of said silicon alloy region.

7. The semiconductor device of claim 1, wherein said collector region contacts said first well, said emitter region and said base region contact said second well, said collector region and said emitter region are doped with dopants of said first conductivity type, and said base region is doped with dopants of said second conductivity type.

8. The semiconductor device of claim 7, wherein said base region and said emitter region contact said silicon alloy region of said second well.

9. The semiconductor device of claim 7, wherein a portion of said second well not including said silicon alloy region defines a drift region between said first portion and said second portion.

10. The semiconductor device of claim 7, wherein said first well comprises a deep implant region including dopants of said first type positioned below said second well.

11. The semiconductor device of claim 1, wherein said collector region, said emitter region, and said base region each comprise at least one fin.

12. The semiconductor device of claim 1, wherein a base material of said first well and a portion of said second well not including said silicon alloy region is silicon.

13. The semiconductor device of claim 12, wherein said silicon region comprises silicon germanium and said base material does not include germanium.

14. A bipolar semiconductor device, comprising:
    a silicon substrate;
    a first well doped with dopants of a first conductivity type defined in said silicon substrate;
    a second well doped with dopants of a second conductivity type different than said first conductivity type defined in said silicon substrate adjacent said first well to define a PN junction between said first and second wells, wherein said second well includes a silicon germanium region displaced from at least an upper portion of said PN junction;

a collector region contacting a first portion of one of said first well or said second well and having a dopant concentration higher than said first or second well contacted by said collector region;

an emitter region contacting a second portion of the other of said first well or said second well and being doped with dopants of said first or second conductivity type different than said first or second well contacted by said emitter region; and a base region contacting a third portion of the other of said first well or said second well and having a dopant concentration higher than said first or second well contacted by said base region, wherein said third portion is positioned between said first and second portions.

15. The semiconductor device of claim 14, wherein said collector region contacts said second well, said emitter region and said base region contact said first well, said collector region and said emitter region are doped with dopants of said first conductivity type, and said base region is doped with dopants of said second conductivity type.

16. The semiconductor device of claim 15, wherein said emitter region comprises a silicon germanium portion.

17. The semiconductor device of claim 15, wherein said collector region contacts said silicon germanium region of said second well, and said second well defines a drift region between said emitter region and said first well.

18. The semiconductor device of claim 14, wherein said collector region contacts said first well, said emitter region and said base region contact said second well, said collector region and said emitter region are doped with dopants of said first conductivity type, and said base region is doped with dopants of said second conductivity type.

19. The semiconductor device of claim 18, wherein said base region and said emitter region contact said silicon germanium region of said second well, said first well comprises a deep implant region including dopants of said first type positioned below said second well, and a portion of said second well not including said silicon germanium region defines a drift region between said emitter region and said first well.

20. The semiconductor device of claim 14, wherein said collector region, said emitter region, and said base region each comprise at least one fin.

* * * * *